US 8,436,685 B2
May 7, 2013

(12) United States Patent
Michiyoshi

(10) Patent No.: US 8,436,685 B2
(45) Date of Patent: May 7, 2013

(54) OSCILLATING CIRCUIT, DC-DC CONVERTER, AND SEMICONDUCTOR DEVICE

(75) Inventor: Takashi Michiyoshi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 149 days.

(21) Appl. No.: 13/063,845

(22) PCT Filed: Aug. 24, 2009

(86) PCT No.: PCT/JP2009/004071
§ 371 (c)(1),
(2), (4) Date: Mar. 14, 2011

(87) PCT Pub. No.: WO2010/032380
PCT Pub. Date: Mar. 25, 2010

(65) Prior Publication Data
US 2011/0163816 A1    Jul. 7, 2011

(30) Foreign Application Priority Data

Sep. 16, 2008    (JP) .................... 2008-236402

(51) Int. Cl.
*H03L 7/085*    (2006.01)
(52) U.S. Cl.
USPC ............................ 331/1 A; 327/156; 363/127
(58) Field of Classification Search .................. 331/1 A; 327/156; 363/127
See application file for complete search history.

(56) References Cited

U.S. PATENT DOCUMENTS

| 2002/0017946 A1 | 2/2002 | Fujii et al. |
| 2002/0105377 A1 | 8/2002 | Masuda et al. |
| 2004/0070434 A1 | 4/2004 | Okuno |

FOREIGN PATENT DOCUMENTS

| JP | 9-266425 | 10/1997 |
| JP | 9-266426 | 10/1997 |
| JP | 2002-56678 | 2/2002 |
| JP | 2002-158549 | 5/2002 |
| JP | 2002-223564 | 8/2002 |
| JP | 3434734 | 5/2003 |
| JP | 2004-46911 | 2/2004 |
| JP | 2007-122871 | 5/2007 |
| JP | 2007-164952 | 6/2007 |

OTHER PUBLICATIONS

International Search Report and Written Opinion in PCT/JP2009/004071, date Aug. 24, 2009.

*Primary Examiner* — Arnold Kinkead
(74) *Attorney, Agent, or Firm* — Cooper & Dunham LLP

(57) ABSTRACT

The oscillating circuit (100) includes a variable frequency oscillating circuit (10) for generating a clock signal (CK) whose frequency increases in response to an up-signal (UP) and decreases in response to a down-signal (DOWN), the frequency going up and down continuously between an upper-limit frequency and a lower-limit frequency. An up/down control circuit (20) outputs the down-signal when a duration of a low level of the clock signal drops below a first delay time and outputs the up-signal when the duration exceeds a second delay time longer than the first delay time.

15 Claims, 10 Drawing Sheets

OSCILLATING CIRCUIT, DC-DC CONVERTER, AND SEMICONDUCTOR DEVICE

TECHNICAL FIELD

The present invention generally relates to frequency control circuits for oscillating circuits.

BACKGROUND ART

In order to save power consumption in electronic devices, highly efficient DC-DC converters are used in power supply circuits. However, a DC-DC converter generates a large switching noise when turning on or off a switching element. This noise is produced not only at the switching frequency but also at its harmonics; i.e., frequencies that are integer-multiples of the switching frequency. As a result, when a DC-DC converter and a radio transmission/reception circuit are integrated on the same semi-conductor device, for example, the switching noise of the DC-DC converter adversely affects frequencies used by the radio transmission/reception circuit.

FIG. 1 shows a conventional oscillating circuit known from Japanese Laid-Open Patent Application No. 9-266425 ("Patent Document 1") or No. 9-266426 ("Patent Document 2"). As shown in FIG. 1, an oscillating element 56 is connected to a reference oscillating circuit 55. The reference oscillating circuit 55 generates an oscillating signal FT having a certain frequency determined by the oscillating element 56. The oscillating signal FT is frequency-divided by a frequency divider 57 to generate a signal CC that is output to a phase comparator 58. The phase comparator 58 compares the phase of the signal CC with the phase of a frequency-divided signal DC output from a frequency divider 64, generating a frequency error signal EPC, which is supplied via a low-pass filter 59 to the base of an NPN transistor 60.

The oscillator 61 includes a CR oscillating circuit and outputs an oscillating signal Fs whose frequency is set by a resistor 62 and a capacitor 63. The transistor 60 is connected in parallel to the resistor 62 so that the resistance value across the resistor 62 can be varied by the transistor 60, thus varying the frequency of the oscillating signal Fs. The oscillating signal Fs is supplied to the frequency divider 64 and a DC-DC control circuit (not shown). The frequency divider 64 divides the oscillating signal Fs at a predetermined dividing ratio that is set by a frequency-division control signal BC output from a station-selecting microprocessor in a tuner unit (not shown) for receiving a radio broadcast.

For example, suppose that the frequency divider 57 generates the signal CC of 5 kHz by dividing the oscillating signal FT while the frequency divider 64 outputs the frequency-divided signal DC by dividing the oscillating signal Fs by 20. The phase comparator 58 compares the signal CC with the frequency-divided signal DC and supplies the frequency error signal EPC to the transistor 60 so that both signals can have the same frequency. Thus, the frequency of the oscillating signal Fs generated by the oscillator 61 is 100 kHz. Because the DC-DC control circuit switches the switching transistor based on this oscillating signal Fs, a noise component is generated at 100 kHz and at its integer-multiple harmonics.

When the tuner unit (not shown) is operated to receive a broadcast radio wave of 999 kHz, for example, the dividing ratio of the frequency divider 64 is set to 21 by the frequency-division control signal BC. Then, the oscillating signal Fs is divided by 21, so that the frequency of the frequency-divided signal DC becomes about 4.76 kHz. The phase comparator 58 outputs the frequency error signal EPC in order to increase the frequency of the oscillating signal Fs so that the frequency of the frequency-divided signal DC becomes 5 kHz. Specifically, the frequency of the oscillating signal Fs is increased to 105 kHz so that the frequency-divided signal DC of 5 kHz can be obtained with the dividing ratio of 21. Because the switching transistor is driven on the basis of the 105 kHz oscillating signal Fs, the switching noise has frequencies different from the frequencies in the reception band of the broadcast radio wave or the frequency of an intermediate frequency signal, thus preventing reception difficulties.

FIG. 2 shows another conventional oscillating circuit known from Patent Document 1 or 2. As shown, a phase comparator 65 is supplied with a reference signal CB of a predetermined frequency generated by a tuner unit (not shown), and with a frequency-divided signal DC from a frequency divider 64. The phase comparator 65 compares the reference signal CB with the frequency-divided signal DC to generate a frequency error signal EFE, which is supplied via a low-pass filter 59 to a transistor 60.

When the dividing ratio of the frequency divider 64 is set at 12, and the inter-station frequency of broadcast radio waves received by the tuner unit is 9 kHz, the reference signal CB of 9 kHz is input to the phase comparator 65. Because the phase comparator 65 generates the frequency error signal EFE so that the reference signal CB and the frequency-divided signal DC can have the same frequency, the frequency of the oscillating signal Fs generated by the oscillator 61 becomes 108 kHz. In this case, when a broadcast radio wave of 1080 kHz is received, the radio wave is affected by the switching noise because the frequency of the received broadcast radio wave is equal to a harmonic component of the switching noise. Thus, the dividing ratio of the frequency divider 64 is changed to 13 by the frequency-division control signal BC. As a result, the frequency of the oscillating signal Fs is changed to 117 kHz, so that the harmonic components of the switching noise stay out of the reception band of the received broadcast radio wave, thus preventing reception difficulties.

FIG. 3 shows another conventional oscillating circuit known from Patent Document 1 or 2. As shown in FIG. 3, an oscillating element 67 is connected to an oscillating circuit 66. The oscillating circuit 66 generates an oscillating signal Fu of a certain frequency determined by the oscillating element 67. The oscillating signal Fu is input to a frequency divider 68.

The frequency divider 68 divides the oscillating signal Fu and outputs an oscillating signal Fs that is supplied to a DC-DC control circuit (not shown) for driving a switching transistor. To the frequency divider 68, there is connected a frequency-division control unit 69 which generates a frequency-division control signal BD for changing the dividing ratio of the frequency divider 68 at certain time intervals con-tinuously or discontinuously.

Because the dividing ratio of the frequency divider 68 is changed by the frequency-division control signal BD at certain time intervals continuously or discontinuously, the frequency of the oscillating signal Fs is also changed at predetermined time intervals. Because the frequency of the oscillating signal Fs as a switching signal is varied continuously or discontinuously, the fundamental frequency components and harmonic frequency components of the switching noise are dispersed. In this way, the amount of noise per unit time at a certain frequency can be reduced, whereby the influence of the generated noise can be reduced to practically acceptable levels.

However, in the examples shown in FIGS. 1 and 2, a special control circuit, such as a CPU, is required for setting the dividing ratio of the frequency divider 64. In the example of FIG. 3, the switching signal is provided by the oscillating signal Fs obtained by dividing the oscillating signal Fu in the frequency divider 68 whose dividing ratio is changed at predetermined time intervals. As a result, the oscillating signal Fs has discrete frequencies. Further, the frequency of the oscillating signal Fs stays the same for a predetermined time. Thus, the oscillating frequency is affected by noise for a predetermined time when the frequency of the tuner unit corresponds to the fundamental frequency of the oscillating signal Fs or its harmonic frequencies.

SUMMARY OF INVENTION

It is a general object of the present invention to provide a novel and useful oscillating frequency control circuit in which one or more of the aforementioned problems of the related art are eliminated.

A more specific object of the present invention is to provide an oscillating frequency control circuit capable of reducing the influence of switching noise to practically acceptable levels without requiring a special control circuit, such as a CPU, and re-gardless of the frequency used in a radio transmission/reception circuit.

According to one embodiment of the present invention, an oscillating circuit includes a variable frequency oscillating circuit configured to generate a clock signal whose frequency increases in response to an up-signal and decreases in response to a down-signal, the frequency going up and down continuously between an upper-limit frequency and a lower-limit frequency; a first delay circuit configured to output a first delayed clock signal by delaying the clock signal output from the variable frequency oscillating circuit by a first delay time; a second delay circuit configured to output a second delayed clock signal by delaying the clock signal by a second delay time longer than the first delay time; a first detection circuit configured to detect that a duration of a high level or a low level of the clock signal is equal to or less than the first delay time by comparing the clock signal with the first delayed clock signal; a second detection circuit configured to detect that the duration of the high level or the low level of the clock signal is equal to or more than the second delay time by comparing the clock signal with the second delayed clock signal; and an up/down control circuit configured to output the up-signal and the down-signal based on an output signal from the first detection circuit and an output signal from the second detection circuit.

The up/down control circuit outputs the down-signal to the variable frequency oscillating circuit upon detection by the first detection circuit of the duration of the high level or the low level of the clock signal being equal to or less than the first delay time. The up/down control circuit outputs the up-signal to the variable frequency oscillating circuit upon detection by the second detection circuit of the duration of the high level or the low level of the clock signal being equal to or more than the second delay time.

BRIEF DESCRIPTION OF DRAWINGS

A complete understanding of the present invention may be obtained by reference to the accompanying drawings, when considered in conjunction with the subsequent, detailed description, in which.

BEST MODE FOR CARRYING OUT THE INVENTION

Figure 1:
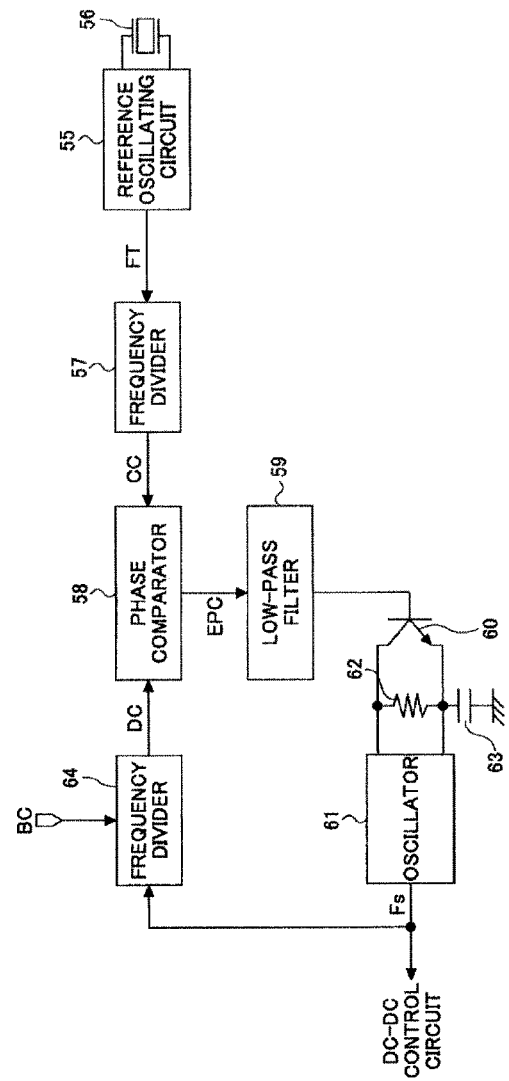
FIG. 1 is a circuit diagram of a conventional oscillating circuit.
Figure 2:
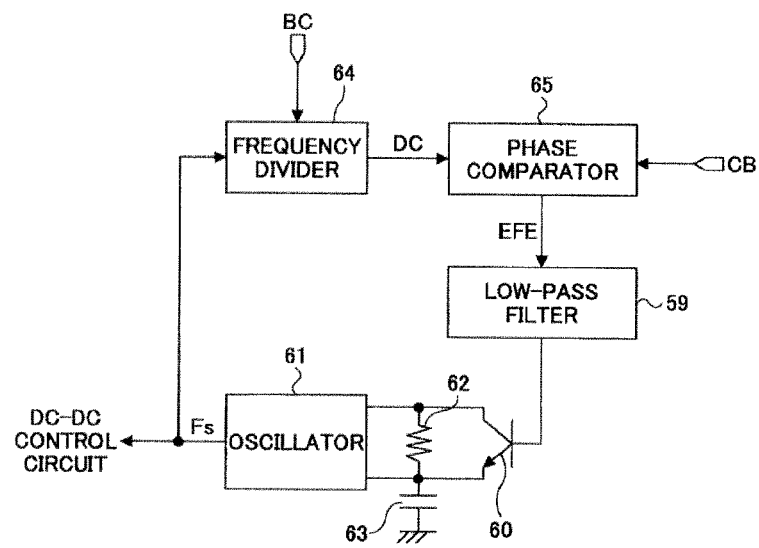
FIG. 2 is a circuit diagram of a second conventional oscillating circuit.
Figure 3:
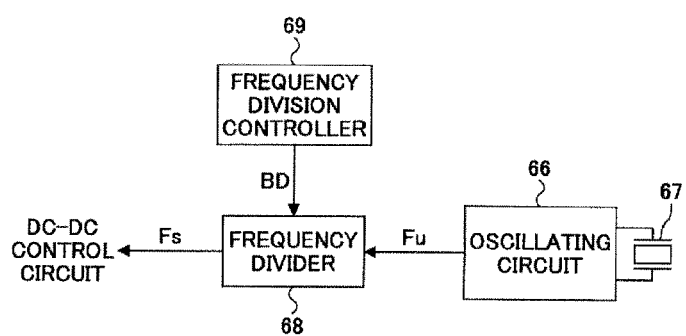
FIG. 3 is a circuit diagram of a third conventional oscillating circuit.

Referring now to the drawings, wherein like reference numerals designate identical or corresponding parts throughout the several views, embodiments of the present invention are described.

Figure 4:
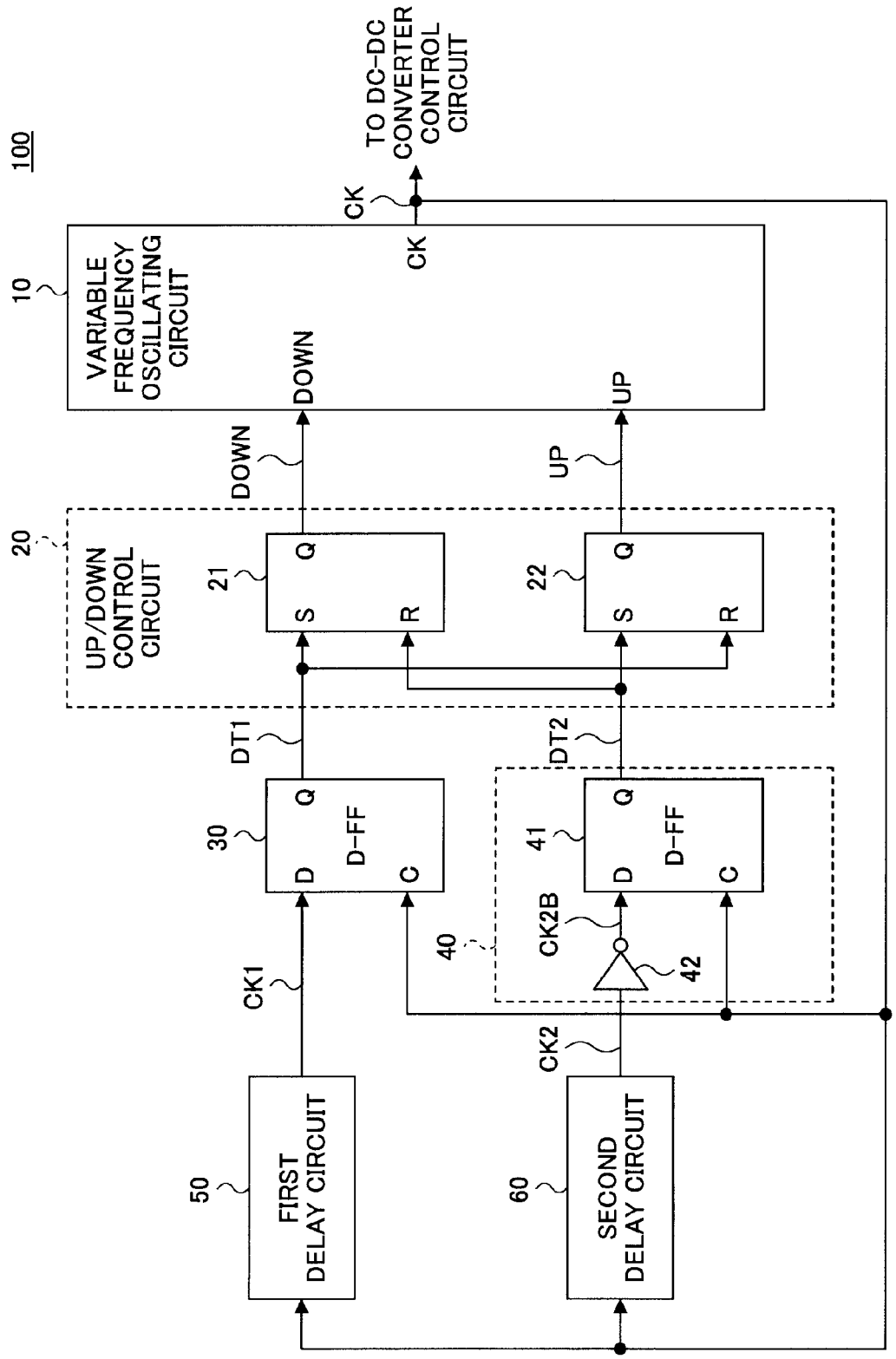
FIG. 4 is a circuit diagram of an oscillating circuit according to an embodiment of the present invention.

FIG. 4 shows a circuit diagram of an oscillating circuit 100 according to an embodiment of the present invention. The oscillating circuit 100 includes a variable frequency oscillating circuit 10; an up/down control circuit 20; a first detection circuit 30; a second detection circuit 40; a first delay circuit 50; and a second delay circuit 60.

The variable frequency oscillating circuit 10 includes a down input terminal DOWN, an up input terminal UP, and a clock output terminal CK. The down input terminal DOWN is supplied with a down-signal DOWN, and the up input terminal UP is supplied with an up-signal UP. When the down-signal DOWN assumes a high level, the frequency of the clock signal CK output from the clock output terminal CK is lowered. When the up-signal UP assumes a high level, the frequency of the clock signal CK at the clock output terminal CK is increased. The clock signal CK is output to a DC-DC converter control circuit (not shown) and used as a switching signal for a switching transistor.

The first delay circuit 50 outputs a first delayed clock signal CK1 which is the clock signal CK delayed by a first delay time. The second delay circuit 60 outputs a second delayed clock signal CK2 which is the clock signal CK delayed by a second delay time longer than the first delay time. The first detection circuit 30 includes a D-type flip-flop circuit which is supplied with the first delayed clock signal CK1 at a data terminal D and with the clock signal CK at a clock terminal C. A first detection signal DT1 is obtained at an output terminal Q. The first detection circuit 40 includes a D-type flip-flop circuit 41 and an inverter circuit 42. The D-type flip-flop circuit 41 is supplied at a data terminal D with an inverted second delayed clock signal CK2B which is obtained by inverting the second delayed clock signal CK2 in the inverter circuit 42. A clock terminal C of the D-type flip-flop circuit 41 is supplied with the clock signal CK. A second detection signal DT2 is output from an output terminal Q of the D-type flip-flop circuit 41.

The up/down control circuit 20 includes two RS latch circuits 21 and 22. The RS latch circuit 21 is supplied at a set terminal S with the first detection signal DT1 and with the second detection signal DT2 at a reset terminal R. A down-signal DOWN is output from an output terminal Q of the RS latch circuit 21. The RS latch circuit 22 is supplied at a set terminal S with the second detection signal DT2 and at a reset terminal R with the first detection signal DT1. An up-signal UP is output from an output terminal Q of the RS latch circuit 22.

Figure 5:
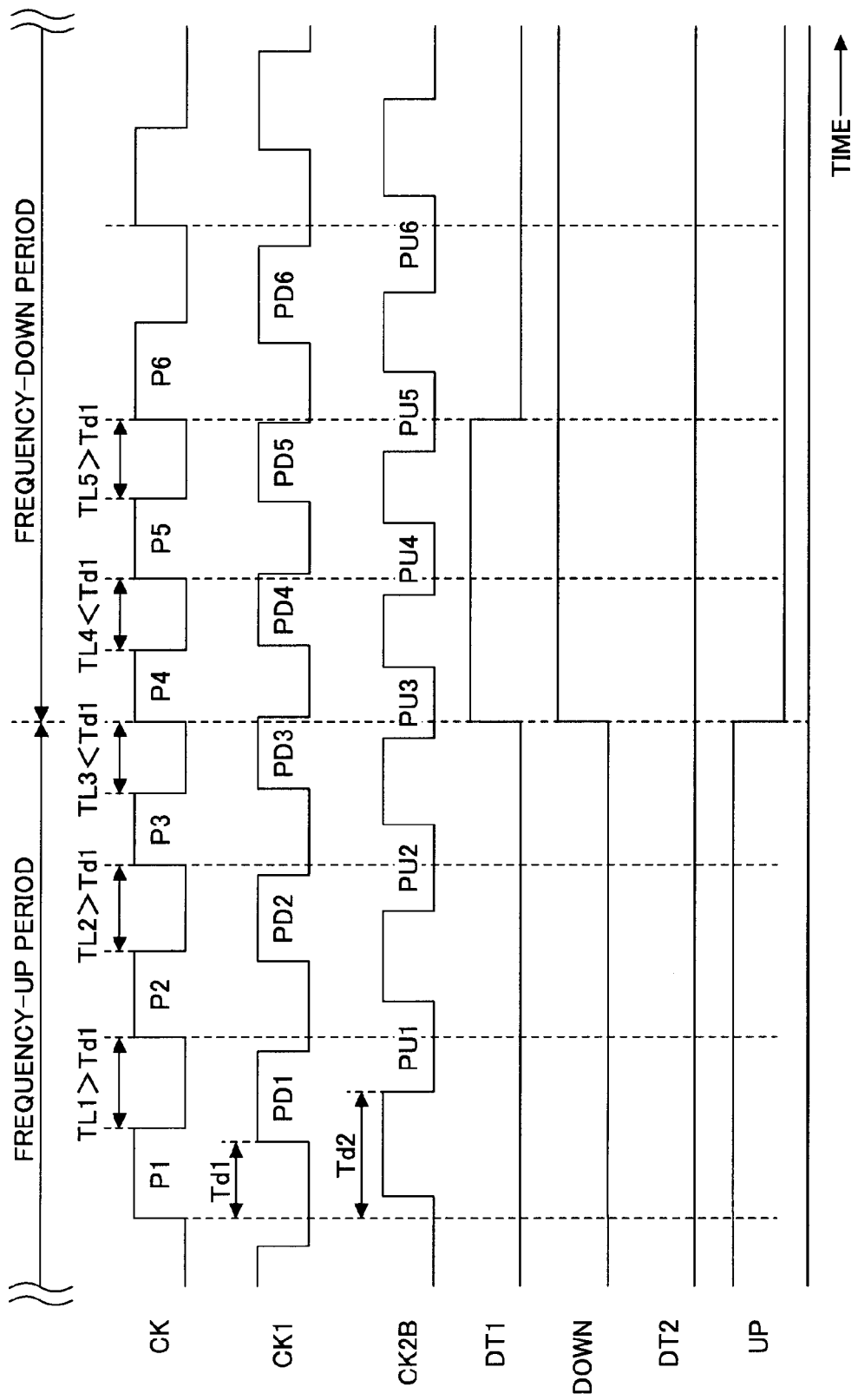
FIG. 5 is a timing chart illustrating an operation of the oscillating circuit of FIG. 4.
Figure 6:
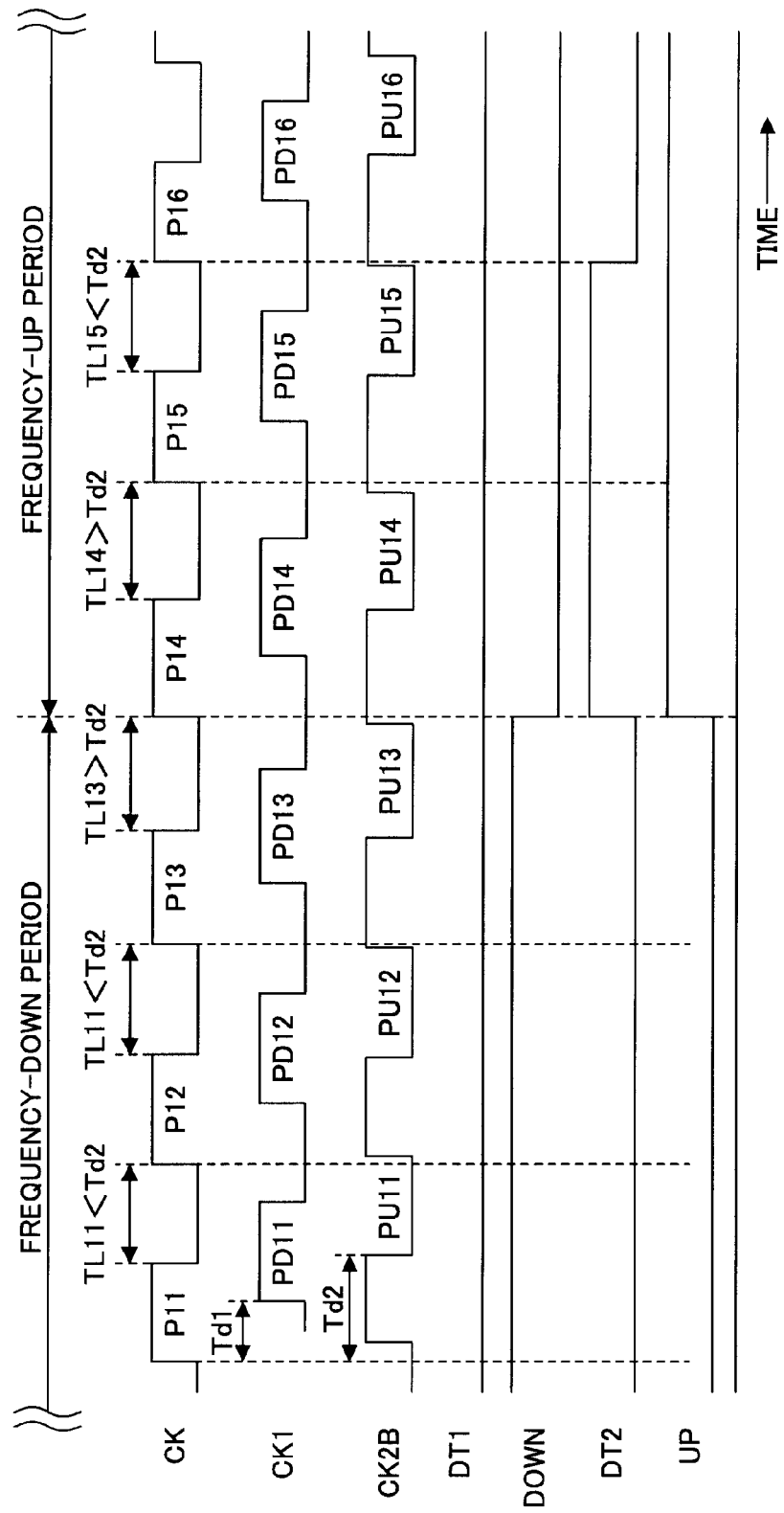
FIG. 6 is another timing chart illustrating an operation of the oscillating circuit of FIG. 4.

Referring to FIGS. 5 and 6, an operation of the oscillating circuit of FIG. 4 is described. FIG. 5 shows a timing chart where the frequency of the clock signal CK starts to decrease after reaching an upper-limit frequency. FIG. 6 shows a timing chart where the frequency of the clock signal CK starts to increase after reaching a lower-limit frequency. In FIGS. 5 and 6, Pn (n is an integer) designates a signal sequence of the clock signal CK; PDn (n is an integer) designates a signal sequence of the first delayed clock signal CK1; PUn (n is an integer) designates a signal sequence of the inverted second delayed clock signal CK2B; Td1 indicates a first delay time; Td2 indicates a second delay time; and TLn (n is an integer) indicates a duration of a low level of the clock signal Pn. In the timing charts of FIGS. 5 and 6, the duty cycle of the clock signal CK is 50%.

By setting the duty ratio of the clock signal at 50% in the above oscillating circuit, the delay time of the first and the second delay circuits can be minimized, while the delay time of the delay circuits of which each of the first and the second delay circuits is comprised can be maximized, thereby enabling a decrease in size of the circuit.

Referring to FIG. 5, in the frequency-up period, the frequency of the clock signal CK is gradually increasing, so that the period of the clock signals P1 to P3 gradually becomes shorter, and therefore the low level time TL1 to TL3 of the clock signals P1 to P3 also becomes shorter. While the low level times TL1 and TL2 of the clock signals P1 and P2 are each longer than the first delay time Td1, the low level time TL3 of the clock signal P3 is shorter than the first delay time Td1.

Because each of the first delayed clock signals PD1 and PD2 at the rise time of each of the clock signals P1 to P3 is at low level, the output DT1 of the first detection circuit 30 is at low level. However, at the rise time of the clock signal P4 following the clock signal P3 whose low level time TL3 has become shorter than the first delay time Td1, the first delayed clock signal PD3 still maintains high level, so that the output DT1 of the first detection circuit 30 changes to high level. Then, the RS latch circuit 21 of the up/down control circuit 20 is set so that the down-signal DOWN assumes high level. At the same time, the RS latch circuit 22 is reset so that the up-signal UP assumes low level. As a result, the variable frequency oscillating circuit 10 operates to lower the frequency of the clock signal CK. Accordingly, the frequency-up period is switched to a frequency-down period from the rise time of the clock signal P4.

In the frequency-down period, the period after the clock signal P4 becomes longer and also the low level time TL becomes longer. In accordance with the present embodiment, the low level time TL5 of the clock signal P5 is longer than the first delay time Td1. At the rise time of the next clock signal P6, the first delayed clock signal PD5 is already back to low level, so that the first detection circuit 30 brings the first detection signal DT1 back to low level. However, the output of the up/down control circuit 20 does not change, and therefore the variable frequency oscillating circuit 10 continues the frequency-down operation.

Thus, in accordance with the present embodiment, when the low level time TL of the clock signal CK becomes shorter than the first delay time Td1, a down-signal DOWN is output, whereby the variable frequency oscillating circuit 10 starts the down-operation. This means that the upper-limit frequency of the variable frequency oscillating circuit 10 can be set by the first delay time Td1. For example, when the duty cycle of the clock signal CK is 50%, in order to set the upper-limit frequency at 2.5 MHz, the first delay time Td1 is set at 200 ns. Because the period of 2.5 MHz is 400 ns, each of the high level time and the low level time is 200 ns. Therefore, by setting the first delay time Td1 at 200 ns, the low level time TL becomes 200 ns or less when the clock signal CK exceeds 2.5 MHz, whereupon the up-signal UP is reset and the down-signal DOWN is set, thereby lowering the frequency from the upper limit of 2.5 MHz.

When the duty cycle of the clock signal CK is other than 50%, the first delay time Td1 may be set equal to the low level time TL of the clock signal CK at the upper-limit frequency.

FIG. 6 shows a timing chart where the frequency starts to increase following the clock signal CK reaching the lower-limit frequency. In FIG. 6, in the frequency-down period, the frequency of the clock signal CK is gradually decreasing, so that the period of the clock signals P11 to P13 gradually becomes longer. As a result, the low level times TL11 to TL13 of the clock signal P11 to P13 also become longer.

The low level times TL11 and TL12 of the clock signals P11 and P12 are each shorter than the second delay time Td2, while the low level time TL13 of the clock signal P13 is longer than the second delay time Td2. Because the inverted second delayed clock signals PU11 and PU12 are both at low level at the rise time of the clock signals P11 to P13, the output DT2 of the second detection circuit 40 is at low level. However, at the rise time of the clock signal P14 following the clock signal P13 whose low level time TL is longer than the second delay time Td2, the inverted second delayed clock signal PU13 is already at high level, so that the output DT2 of the second detection circuit 40 changes to high level. As a result, the RS latch circuit 22 of the up/down control circuit 20 is set, whereby the up-signal UP assumes high level. At the same time, the RS latch circuit 21 is reset, so that the down-signal DOWN assumes low level. As a result, the variable frequency oscillating circuit 10 operates to increase the frequency of the clock signal CK. Namely, the frequency-down period is switched to the frequency-up period from the rise time of the clock signal P14.

In the frequency-up period, the period following the clock signal P14 becomes shorter, and also the low level time TL becomes shorter. In accordance with the present embodiment, the low level time TL15 of the clock signal P15 is shorter than the second delay time Td2, so that the inverted second delayed clock signal PU15 still maintains low level at the rise time of the next clock signal P16. Therefore, the second detection circuit 40 brings the second detection signal DT2 back to low level. However, the output of the up/down control circuit 20 does not change, so that the variable frequency oscillating circuit 10 maintains the frequency-up operation.

Thus, in accordance with the present embodiment, the frequency of the clock signal CK starts to increase when the low level time TL of the clock signal CK becomes longer than the second delay time Td2. This means that the lower-limit frequency of the variable frequency oscillating circuit 10 can be set by the second delay time Td2. For example, when the duty cycle of the clock signal CK is 50%, in order to set the lower-limit frequency at 1.5 MHz, the second delay time Td2 is set at 333 ns. Because the period of 1.5 MHz is about 666 ns, the high level time and the low level time are each 333 ns. Thus, by setting the second delay time Td2 at 333 ns, the low level time TL becomes 333 ns or longer when the clock signal CK drops below 1.5 MHz, whereupon the down-signal DOWN is reset and the up-signal UP is set, thereby increasing the frequency from the lower limit of 1.5 MHz.

When the duty cycle of the clock signal CK is other than 50%, the second delay time Td2 may be set equal to the low level time TL of the clock signal CK at the lower-limit frequency.

In accordance with the present embodiment, the low level time of the clock signal CK is compared with the first and the second delay times Td1 and Td2 because the first and the second detection circuits 30 and 40, i.e., the D-type flip-flop circuits, operate so that the state at the data terminal D is read at the rise of the clock signal CK. When the data is read at the fall of the clock signal CK, the high level time of the clock signal CK may be compared with the first and the second delay times Td1 and Td2.

Further, in accordance with the present embodiment, while the down-signal DOWN and the up-signal UP are input as control signals to the variable frequency oscillating circuit 10, the two signals may be combined into a single UP/DOWN signal. In this case, an up-operation may be performed when the UP/DOWN signal is at high level and a down-operation may be performed when the UP/DOWN signal is at low level.

When the two signals of the down-signal DOWN and the up-signal UP are used, the up-operation and the down-operation may be terminated in order to maintain the current frequency when the down-signal DOWN and the up-signal UP are at the same level.

Thus, in the oscillating circuit of the present embodiment, the oscillating frequency goes up and down continuously between a predetermined lower-limit frequency (such as 1.5 MHz) and a predetermined upper-limit frequency (such as 2.5 MHz). As a result, when the oscillating circuit is used for generating the switching clock signal for a DC-DC converter in a radio transmission/reception circuit, for example, the noise produced by the switching frequency is dispersed continuously across a wide frequency range. Therefore, the switching frequency affects the particular frequencies used in the radio transmission/reception circuit only momentarily, so that the switching noise can be significantly reduced to practically acceptable levels.

Figure 7:
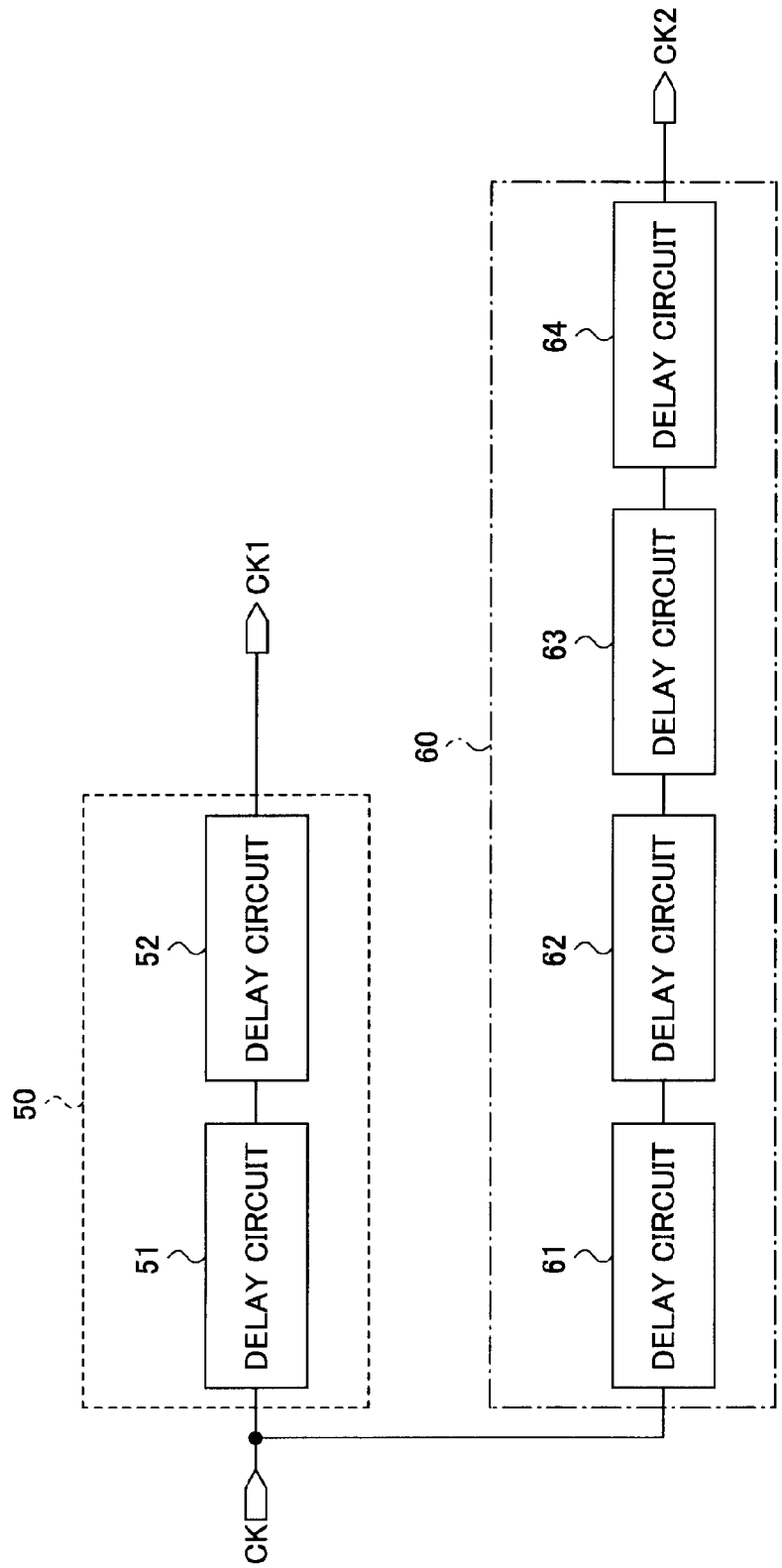
FIG. 7 is a block diagram of a first and a second delay circuit in the oscillating circuit of FIG. 4.

FIG. 7 is a block diagram of the first and the second delay circuits 50 and 60 of FIG. 4. The first delay circuit 50 includes a series connection of delay circuits 51 and 52. The second delay circuit 60 includes a series connection of delay circuits 61 through 64. The delay time Td of each of these delay circuits 51, 52, and 61 through 64 is set to be one half or less of the shortest one of the high level or low level times of the clock signal CK, for a reason described later.

Figure 8:
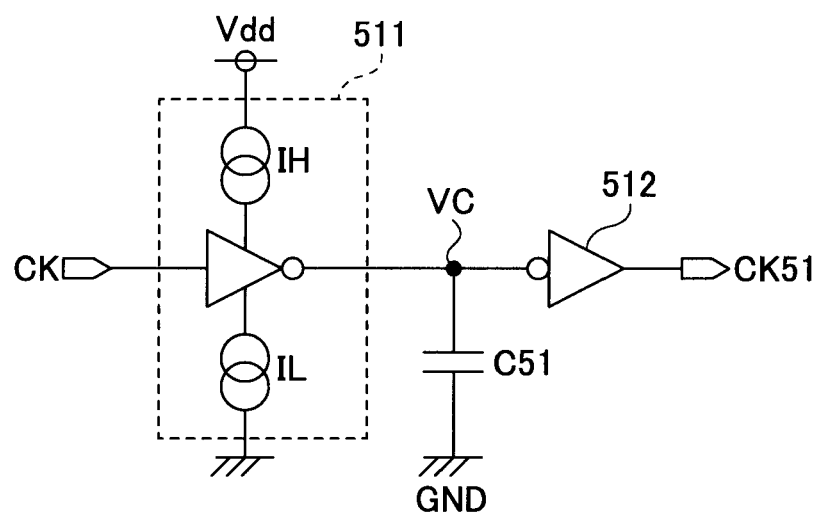
FIG. 8 is a circuit diagram of one of delay circuits in the first and the second delay circuits of FIG. 7.

FIG. 8 is a circuit diagram of each of the delay circuits 51, 52, and 61 through 64 (which have the same structure) of FIG. 7. In the following, the structure and operation of the delay circuit 51 are described as a representative example. The delay circuit 51 includes a constant current inverter circuit 511, an inverter circuit 512, and a capacitor C51. The constant current inverter circuit 511 is supplied at an input with a clock signal CK. A capacitor C51 is connected between an output of the constant current inverter circuit 511 and a ground terminal GND. The output is also connected to an input of the inverter circuit 512, whose output produces a delayed clock signal CK51. The constant current inverter circuit 511 includes a current source IH for supplying a source current and a current source IL for supplying a sink current to the output, so that the capacitor C51 can be charged or discharged with a constant current. The current source IH and the current source IL have the same current value. The input threshold voltage of the inverter circuit 512 is set to be one half of the power supply voltage Vdd.

Figure 9:
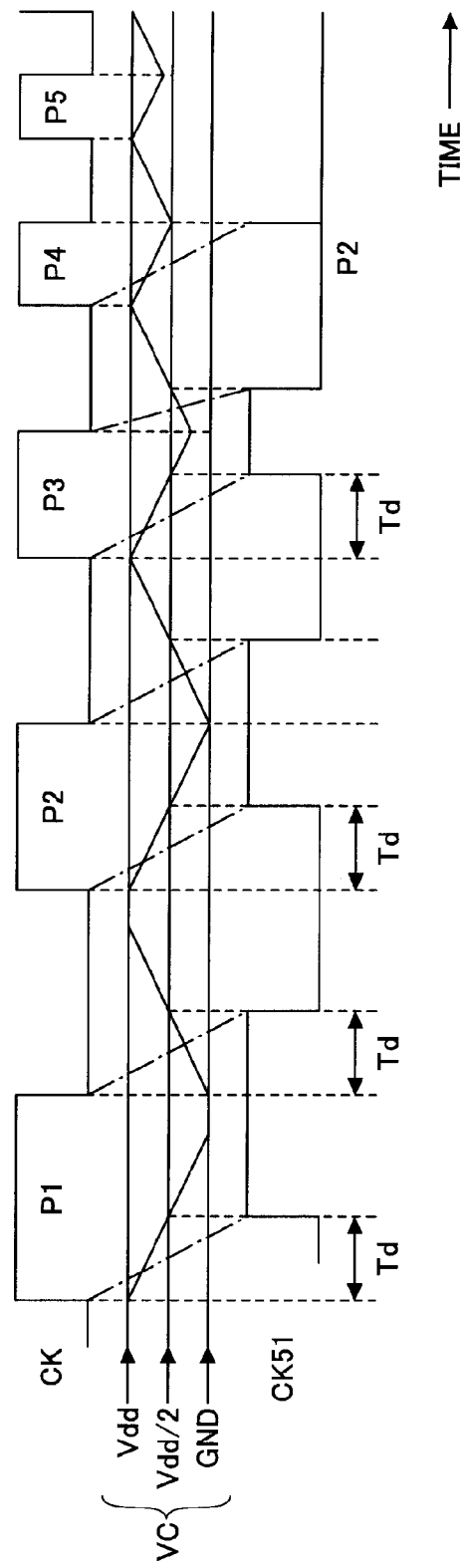
FIG. 9 is a timing chart illustrating an operation of the delay circuit of FIG. 5.

FIG. 9 is a timing chart of an operation of the delay circuit 51 of FIG. 8 concerning the clock signal CK input to the delay circuit 51. In the case of a clock signal P1 whose high and low level times are sufficiently longer than the delay time Td, once the clock signal P1 is at a high level, the output voltage VC of the constant current inverter circuit 511 tends to change from high level to low level. However, because the capacitor C51 is charged up to the power supply voltage Vdd, the output voltage VC decreases linearly at a gradient determined by the current source IL and the capacitance of the capacitor C51, as shown in FIG. 9.

When the output voltage VC decreases to one half the power supply voltage Vdd, the output of the inverter circuit 512, i.e., the delayed clock signal CK51, is inverted to assume high level. The time between the rise of the clock signal P1 to high level and the rise of the delayed clock signal CK51 to high level is the delay time Td of the delay circuit 51. Thereafter, the output voltage VC of the constant current inverter circuit 511 further decreases until it reaches the ground potential GND.

Once the clock signal P1 falls to low level, the capacitor C51 is charged by the current source IH. Then, the output voltage VC increases linearly at a gradient determined by the current source IH and the capacitance of the capacitor C51. The output of the inverter circuit 512 is inverted upon the output voltage VC reaching one half of the power supply voltage Vdd, so that the delayed clock signal CK51 falls to low level. Because the current source IH and the current source IL have the same current value, the time between the fall of the clock signal P1 to low level and the fall of the delayed clock signal CK51 to low level is equal to the delay time Td. Thus, each of the high and low level times of the delayed clock signal CK51 maintains the same time as the clock signal CK, as indicated by alternate long and short dashed lines.

In the case of the clock signal P2 whose high and low level times are each twice the delay time Td, the high and low level times of the delayed clock signal CK51 do not change because, as will be seen from the timing chart, the output voltage VC of the constant current inverter circuit 511 reaches GND and the power supply voltage Vdd within the periods of the high level and the low level of the clock signal P2.

However, in the case of the clock signal P3 where the high and low level times are each less than twice the delay time Td, the high level period ends and the low level period begins before the output voltage VC of the constant current inverter circuit 511 reaches the ground potential GND. As a result, the high level time of the delayed clock signal CK51 is shorter than the high level time of the clock signal P3. Further, in the case of the clock signals P4 and P5 with even shorter high and low level times, the high level of the delayed clock signal CK51 obtained via the delay circuit may become extremely short, or even so short that no high level signal is output.

Thus, in accordance with the present embodiment, the maximum delay time of all of the delay circuits 51 through 64 is set to be one half of the shortest time of the high and low levels. In this way, the output signals of the first and the second delay circuits 50 and 60, i.e., the first delayed clock signal CK1 and the second delayed clock signal CK2, can maintain the same high level and low level times as those of the original clock signal CK.

Figure 10A:
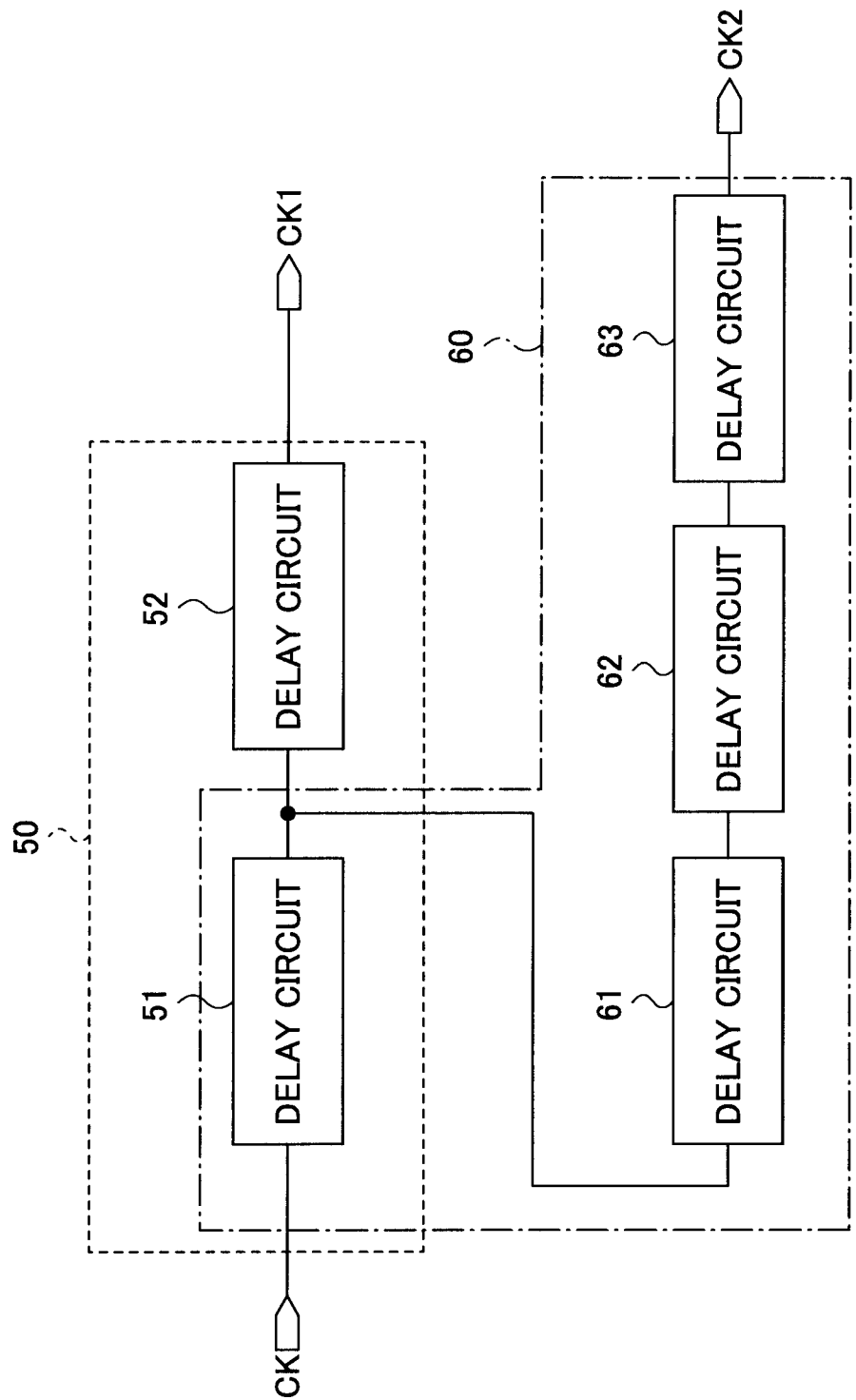
FIG. 10A is a block diagram of a delay circuit according to a first variation.

FIG. 10A is a block diagram of a delay circuit according to a first variation, in which a part of the second delay circuit 60 is provided by a part of the first delay circuit 50. The first delay circuit 50 includes delay circuits 51 and 52 enclosed by a broken line. The second delay circuit 60 includes delay circuits 51, 61, 62, and 63 enclosed by an alternate long and short dashed line. Thus, the delay circuit 51 is shared by the first delay circuit 50 and the second delay circuit 60.

Figure 10B:
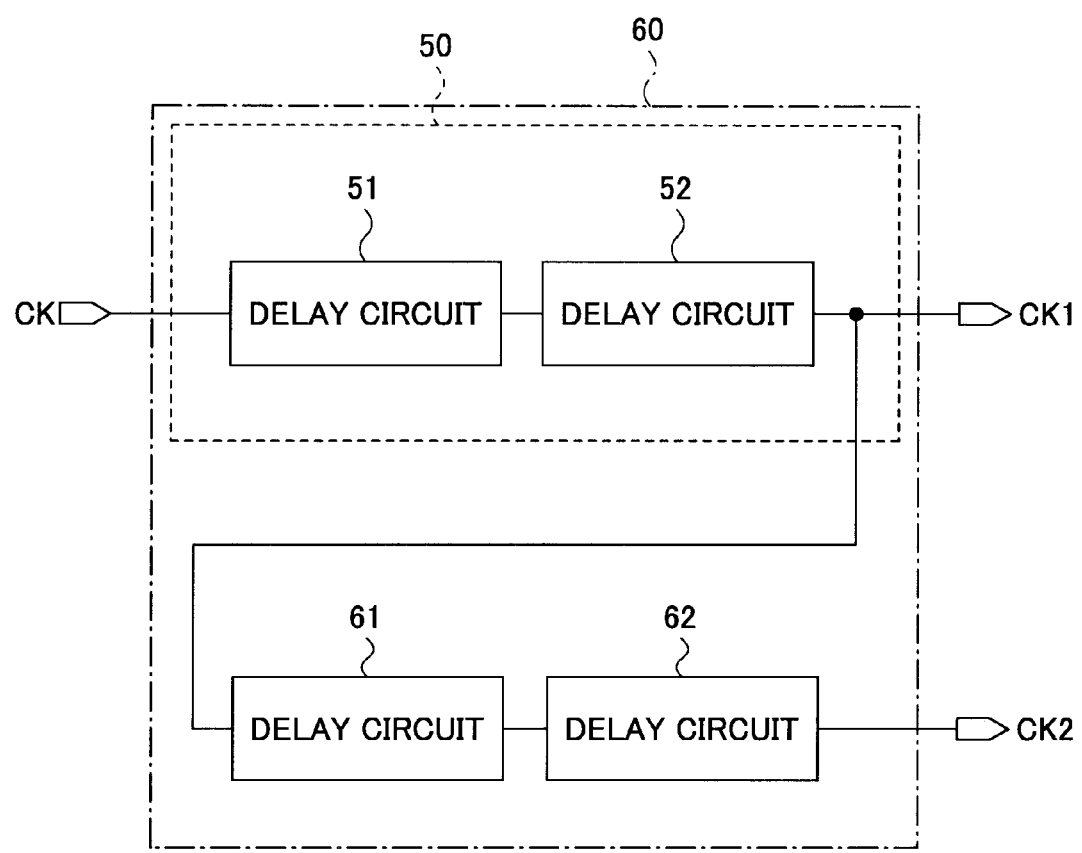
FIG. 10B is a block diagram of a delay circuit according to a second variation.

FIG. 10B is a block diagram of a second variation, in which a part of the second delay circuit 60 provides the entire first delay circuit 50. The first delay circuit 50 includes delay circuits 51 and 52 enclosed by a broken line. The second delay circuit 60, enclosed by an alternate long and short dashed line, includes the first delay circuit 50 and a series connection of the delay circuits 61 and 62 connected to the first delay circuit 50. Thus, by using the first delay circuit 50 as a part of the second delay circuit 60, the size of the second delay circuit 60 can be reduced.

As described above, in accordance with an embodiment of the present invention, the switching frequency of a DC-DC converter is changed continuously between a predetermined lower-limit frequency and a predetermined upper-limit frequency, so that the switching noise can be continuously dispersed within a predetermined frequency range. Thus, the switching noise has a frequency that affects a particular frequency used in a radio transmission/reception circuit, for example, only momentarily, thus significantly reducing the influence of the switching noise to practically acceptable levels. As a result, the DC-DC converter and the radio transmission/reception circuit can be mounted on the same semiconductor device.

Further, because two delay circuits each having a predetermined delay time are used for setting the lower-limit frequency and the upper-limit frequency, the need for a reference clock signal generating circuit or a specialized control circuit, such as a CPU, can be eliminated, thus simplifying the circuit. The delay circuit is further simplified by a simple structure of the delay circuit based on the charge/discharge time of a capacitor.

Although the exemplary embodiment of the invention has been described with a degree of particularity, it is the intent that the invention include all modifications and alterations from the disclosed design falling within the spirit or scope of the appended claims.

The present application is based on the Japanese Priority Application No. 2008-236402 filed Sep. 16, 2008, the entire contents of which are hereby incorporated by reference.

The invention claimed is:

1. An oscillating circuit comprising:
   a variable frequency oscillating circuit configured to generate a clock signal whose frequency increases in response to an up-signal and decreases in response to a down-signal, the frequency going up and down continuously between an upper-limit frequency and a lower-limit frequency;
   a first delay circuit configured to output a first delayed clock signal by delaying the clock signal output from the variable frequency oscillating circuit by a first delay time;
   a second delay circuit configured to output a second delayed clock signal by delaying the clock signal by a second delay time longer than the first delay time;
   a first detection circuit configured to detect that a duration of a high level or a low level of the clock signal is equal to or less than the first delay time by comparing the clock signal with the first delayed clock signal;
   a second detection circuit configured to detect that the duration of the high level or the low level of the clock signal is equal to or more than the second delay time by comparing the clock signal with the second delayed clock signal; and
   an up/down control circuit configured to output the up-signal and the down-signal based on an output signal from the first detection circuit and an output signal from the second detection circuit,
   wherein the up/down control circuit outputs the down-signal to the variable frequency oscillating circuit upon detection by the first detection circuit of the duration of the high level or the low level of the clock signal being equal to or less than the first delay time, and
   wherein the up/down control circuit outputs the up-signal to the variable frequency oscillating circuit upon detection by the second detection circuit of the duration of the high level or the low level of the clock signal being equal to or more than the second delay time.

2. The oscillating circuit according to claim 1, wherein each of the first delay circuit and the second delay circuit includes a series connection of a plurality of delay circuits each having a delay time shorter than one half of a shortest duration of the high level or the low level of the clock signal.

3. The oscillating circuit according to claim 2, wherein each of the plurality of delay circuits includes a capacitor, and wherein the delay time is determined by a charge/discharge time of the capacitor.

4. The oscillating circuit according to claim 1, wherein a part of the second delay circuit is provided by a part or the entirety of the first delay circuit.

5. The oscillating circuit according to claim 1, wherein the first detection circuit includes a D-type flip-flop circuit of which a data terminal is supplied with the first delayed clock signal and of which a clock terminal is supplied with the clock signal, wherein the output signal of the first detection circuit is obtained at an output terminal of the D-type flip-flop circuit.

6. The oscillating circuit according to claim 1, wherein the second detection circuit includes a D-type flip-flop circuit of which a data terminal is supplied with a signal obtained by inverting the second delayed clock signal and of which a clock terminal is supplied with the clock signal, wherein the output signal of the second detection circuit is obtained at an output terminal of the D-type flip-flop circuit.

7. The oscillating circuit according to claim 1, wherein the clock signal has a duty cycle of 50%.

8. The oscillating circuit according to claim 7, wherein the first delay time is set at one half a period of the upper-limit frequency, and wherein the second delay time is set at one half of a period of the lower-limit frequency.

9. A DC-DC converter comprising a switching transistor, wherein the clock signal output by the oscillating circuit according to claim 1 is used as an on/off signal for turning on or off the switching transistor.

10. The DC-DC converter according to claim 9, wherein the DC-DC converter is configured as a power supply for a radio transmission circuit, a radio reception circuit, or a radio transmission/reception circuit.

11. A semiconductor device comprising the DC-DC converter according to claim 10,
    wherein the DC-DC converter and the radio transmission circuit, the radio reception circuit, or the radio transmission/reception circuit are integrated on the same semiconductor device.

12. The oscillating circuit according to claim 2, wherein a part of the second delay circuit is provided by a part or the entirety of the first delay circuit.

13. The oscillating circuit according to claim 3, wherein a part of the second delay circuit is provided by a part or the entirety of the first delay circuit.

14. The oscillating circuit according to claim 3, wherein the clock signal has a duty cycle of 50%.

15. A DC-DC converter comprising a switching transistor, wherein the clock signal output by the oscillating circuit according to claim 7 is used as an on/off signal for turning on or off the switching transistor.

\* \* \* \* \*